(12) United States Patent
Deng et al.

(10) Patent No.: US 9,679,969 B2
(45) Date of Patent: Jun. 13, 2017

(54) SEMICONDUCTOR DEVICE INCLUDING EPITAXIALLY FORMED BURIED CHANNEL REGION

(71) Applicant: International Business Machines Corporation, Armonk, NY (US)

(72) Inventors: Jie Deng, San Jose, CA (US); Pranita Kerber, Mount Kisco, NY (US); Qiqing C. Ouyang, Yorktown Heights, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/353,418

(22) Filed: Nov. 16, 2016

(65) Prior Publication Data

US 2017/0069718 A1    Mar. 9, 2017

Related U.S. Application Data

(63) Continuation of application No. 15/058,421, filed on Mar. 2, 2016, which is a continuation of application No. 14/840,279, filed on Aug. 31, 2015.

(51) Int. Cl.
| | | |
|---|---|---|
| *H01L 29/66* | (2006.01) | |
| *H01L 29/10* | (2006.01) | |
| *H01L 29/51* | (2006.01) | |
| *H01L 29/78* | (2006.01) | |
| *H01L 29/06* | (2006.01) | |
| *H01L 29/165* | (2006.01) | |

(52) U.S. Cl.
CPC ...... *H01L 29/1054* (2013.01); *H01L 29/0649* (2013.01); *H01L 29/165* (2013.01); *H01L 29/517* (2013.01); *H01L 29/66545* (2013.01); *H01L 29/66795* (2013.01); *H01L 29/785* (2013.01)

(58) Field of Classification Search
CPC . H01L 29/6681; H01L 29/785; H01L 29/802; H01L 29/812; H01L 29/66795
USPC .................. 257/390, 403, 282, 296
See application file for complete search history.

(56) References Cited

U.S. PATENT DOCUMENTS

| | | |
|---|---|---|
| 8,896,072 B2 | 11/2014 | Tan et al. |
| 2015/0228725 A1 | 8/2015 | Tsai et al. |
| 2016/0035878 A1 | 2/2016 | Harley et al. |

*Primary Examiner* — Julio J Maldonado
*Assistant Examiner* — Hajar Kolahdouzan
(74) *Attorney, Agent, or Firm* — Cantor Colburn LLP; Vazken Alexanian

(57) ABSTRACT

A semiconductor device includes at least one semiconductor fin on an upper surface of a substrate. The at least one semiconductor fin includes a channel region interposed between opposing source/drain regions. A gate stack is on the upper surface of the substrate and wraps around sidewalls and an upper surface of only the channel region. The channel region is a dual channel region including a buried channel portion and a surface channel portion that completely surrounds the buried channel.

1 Claim, 24 Drawing Sheets

TOP VIEW

TOP VIEW

CROSS-SECTION PERPENDICULAR TO
FIN, CUTTING THROUGH THE GATE

TOP VIEW

TOP VIEW

TOP VIEW

CROSS-SECTION PARALLEL TO FIN

CROSS-SECTION PARALLEL TO FIN

TOP VIEW

TOP VIEW

US 9,679,969 B2

SEMICONDUCTOR DEVICE INCLUDING EPITAXIALLY FORMED BURIED CHANNEL REGION

DOMESTIC PRIORITY

This application is a continuation of U.S. patent application Ser. No. 15/058,421, filed Mar. 2, 2016, which is a continuation of U.S. patent application Ser. No. 14/840,279, filed Aug. 31, 2015, the disclosures of each are incorporated by reference herein in their entireties.

BACKGROUND

The present invention relates to generally semiconductor devices, and more specifically, to the fabrication of fin-type semiconductor devices.

As the desire to reduce semiconductor scaling continues, planar-type semiconductor devices have been replaced with fin-type semiconductor devices, which are typically referred to as fin-type field effect transistor devices, or "finFETs." Recent studies have shown that the implementation of high-k gate dielectrics in the gate stack surrounding the channel region can further contribute to the scale reduction of finFET devices.

Hafnium-based materials such as hafnium oxide ($HfO_2$) and hafnium silicate oxynitride ($HfSi_xO_yN_z$), for example, are considered the most promising high-k gate dielectric candidates because of their high thermodynamic stability, high permittivity, wide bandgap, and large band offset with respect to conventional channel materials. However, the presence of high-k layers and changes in thickness in the channel region has a significant impact on the electrical characteristics of the finFET device. For instance, high-k materials are susceptible to fabrication processing damage and/or high-k layer crystallization near the gate edge which can result in trapping and de-trapping of carriers. These traps have energies close to the silicon conduction-band edge, and therefore can introduce undesirable noise, typically referred to as flicker noise, in the channel region. The noise magnitude (i.e., 1/f) and the effective oxide trap density in finFETs implementing high-k dielectric transistors can generate noise magnitudes reaching one to two orders higher than those in $SiO_2$ and SiON devices. The thickness of the interfacial layer also has a key role in the susceptibility of carrier trappings, and thus the overall noise levels.

SUMMARY

According to at least one non-limiting embodiment of the present invention, a semiconductor device includes at least one semiconductor fin on an upper surface of a substrate. The at least one semiconductor fin includes a channel region interposed between opposing source/drain regions. A gate stack is on the upper surface of the substrate and wraps around sidewalls and an upper surface of only the channel region. The channel region is a dual channel region including a buried channel portion and a surface channel portion that completely surrounds the buried channel.

According to another non-limiting embodiment, a method of fabricating a finFET device comprises forming, on an upper surface of a semiconductor substrate, at least one semiconductor fin comprising a first semiconductor material, the at least one semiconductor fin having a channel region interposed between opposing source/drain regions. The method further includes forming a flowable insulator layer on the source/drain regions, and forming a dummy gate structure on the channel region. The method further includes selectively removing the dummy gate structure with respect to the flowable insulator layer so as to form a gate pocket that exposes the channel region of the at least one semiconductor fin. The method further includes depositing a heterojunction semiconductor material in the gate pocket so as to form a dual channel region including a surface channel portion that completely surrounds a buried channel portion.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification.

FIGS. 1A-10B are a series of views illustrating a method of forming a finFET device according to embodiments of the disclosure, in which:

FIG. 1A is a top view of a starting semiconductor-on-insulator (SOI) substrate according to a non-limiting embodiment;

FIG. 10B illustrates the SOI substrate of FIG. 10A in the second orientation showing the metal gate structure atop the buried insulator layer and wrapping around the dual channel region, and the source/drain electrodes extending through the flowable insulator layer so as to contact the merged source/drain regions.

DETAILED DESCRIPTION

Various embodiments of the invention provide a finFET device including a buried-channel that provides low noise and high mobility, while having superior short-channel characteristics such as, for example, shallow threshold voltage roll off and reduced drain-induced barrier lowering. At least one embodiment includes a dual channel region including a surface channel portion that completely surrounds a buried channel portion. For a n-type metal-oxide-semiconductor field-effect transistor (i.e., a NMOS transistor), the buried channel portion comprises a semiconductor material such as silicon (Si), for example, while the surface channel portion comprises a heterojunction semiconductor material such as, for example, silicon germanium (SiGe). The SiGe material may also be doped with a group III material such as boron, for example. For a p-type metal-oxide-semiconductor field-effect transistor (i.e., a PMOS transistor), the buried channel portion comprises SiGe, for example, while the surface channel portion comprises SiGe or another heterojunction semiconductor material. When forming the PMOS transistor, however, the heterojunction semiconductor material can be doped with group V material such as phosphorous, for example. In this manner, at least one embodiment provides a finFET device including a dual channel region for increasing the carrier density in the buried channel portion with respect to the surface channel portion. Accordingly, at least one embodiment provides a finFET device having a reduced charge density at the gate-dielectric interface thereby reducing the carrier number fluctuation and the flicker noise (i.e., 1/f). In addition, the dual channel region increases the distance of the carriers further away from the high-k gate dielectric which achieves benefits similar to those realized in FETs having a thicker interfacial SiON layer. However, reduced flicker noise is achieved without the need to increase the interfacial SiON layer. Accordingly, the gate length ($L_G$)-scaling of a finFET device is reduced compared to conventional finFET devices.

Figure 1A:
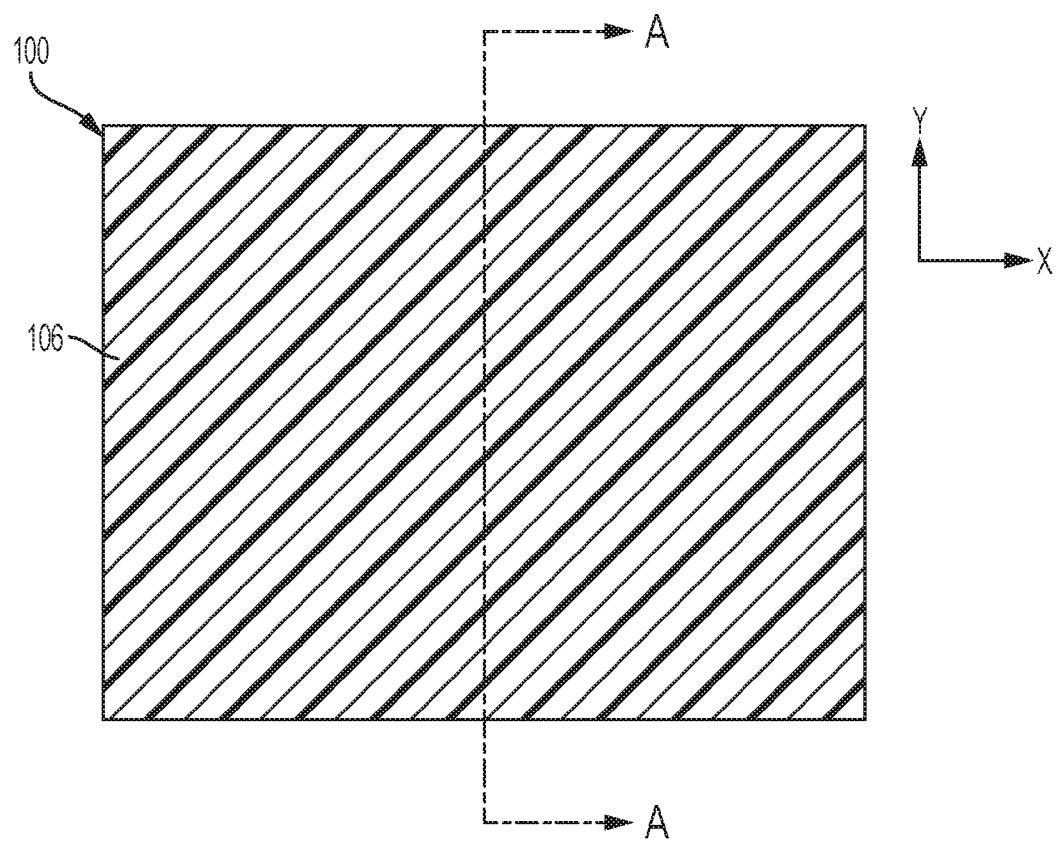
Figure 1B:
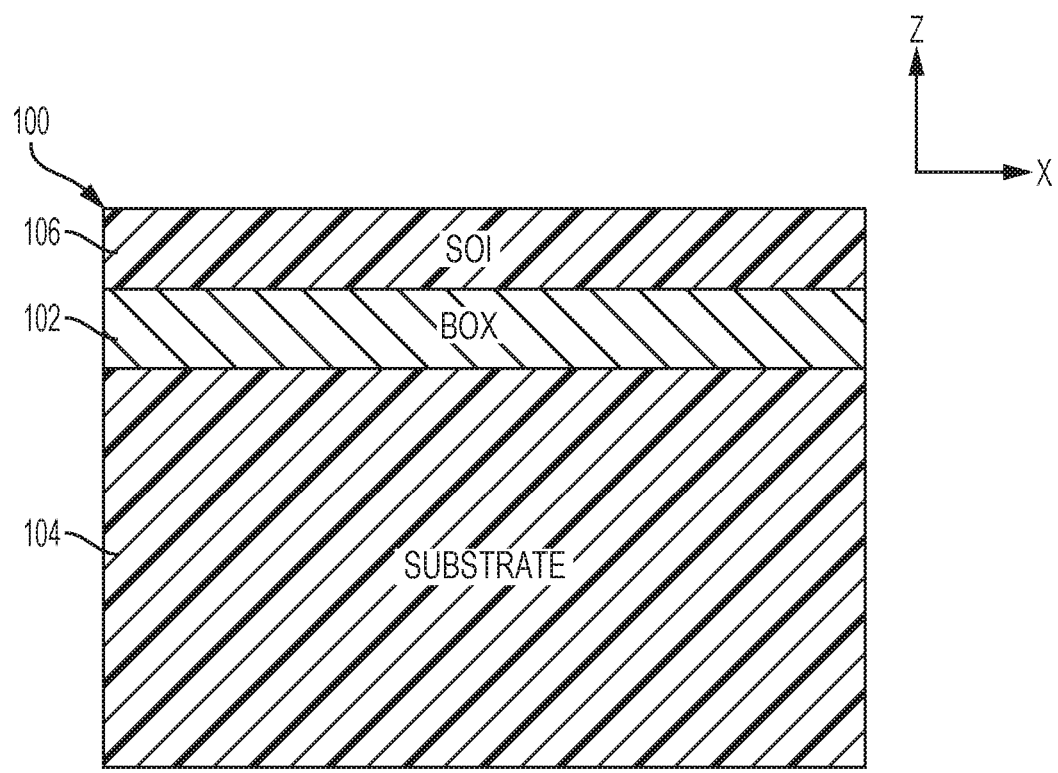
FIG. 1B is a cross-sectional view of the starting SOI substrate taken along the line A-A of FIG. 1A showing a buried insulator layer interposed between a lower bulk substrate and an upper semiconductor layer.
Figure 2A:
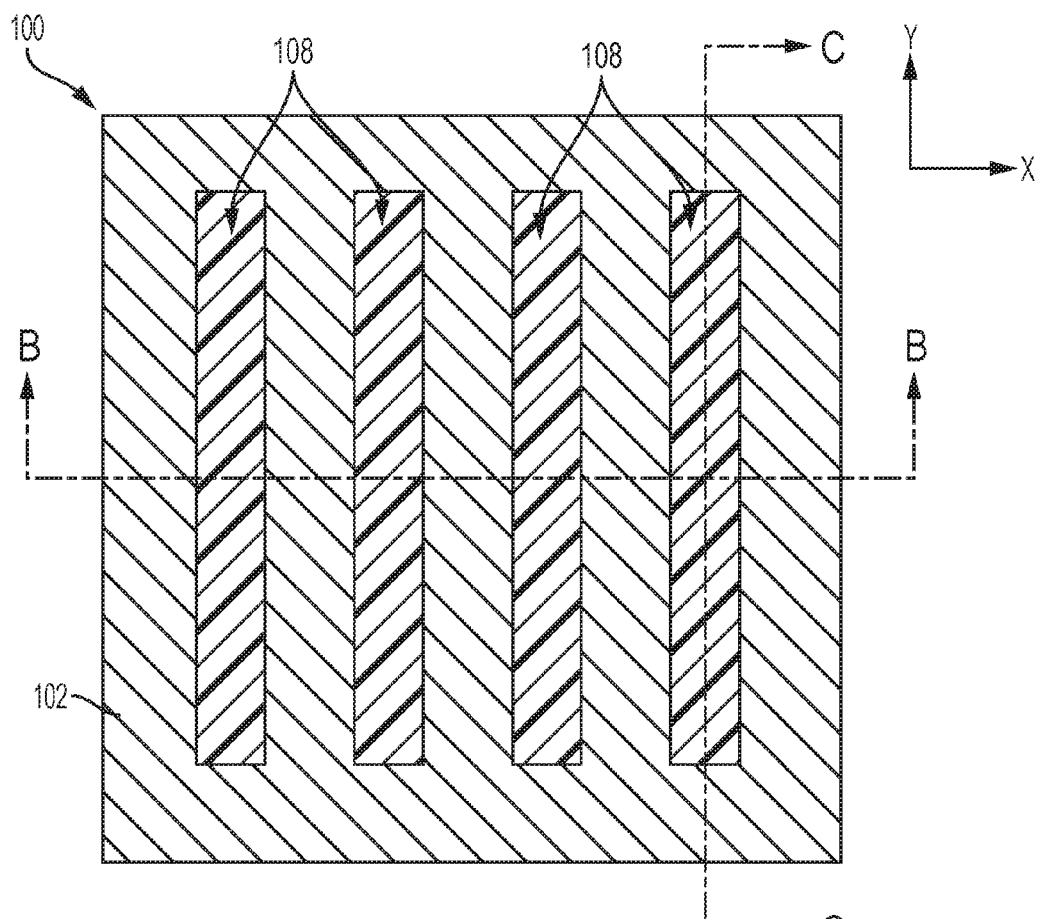
FIG. 2A is a top view of the SOI substrate shown in FIGS. 1A-1B after patterning the semiconductor layer to form a plurality of semiconductor fins atop the buried insulator layer.
Figure 2B:
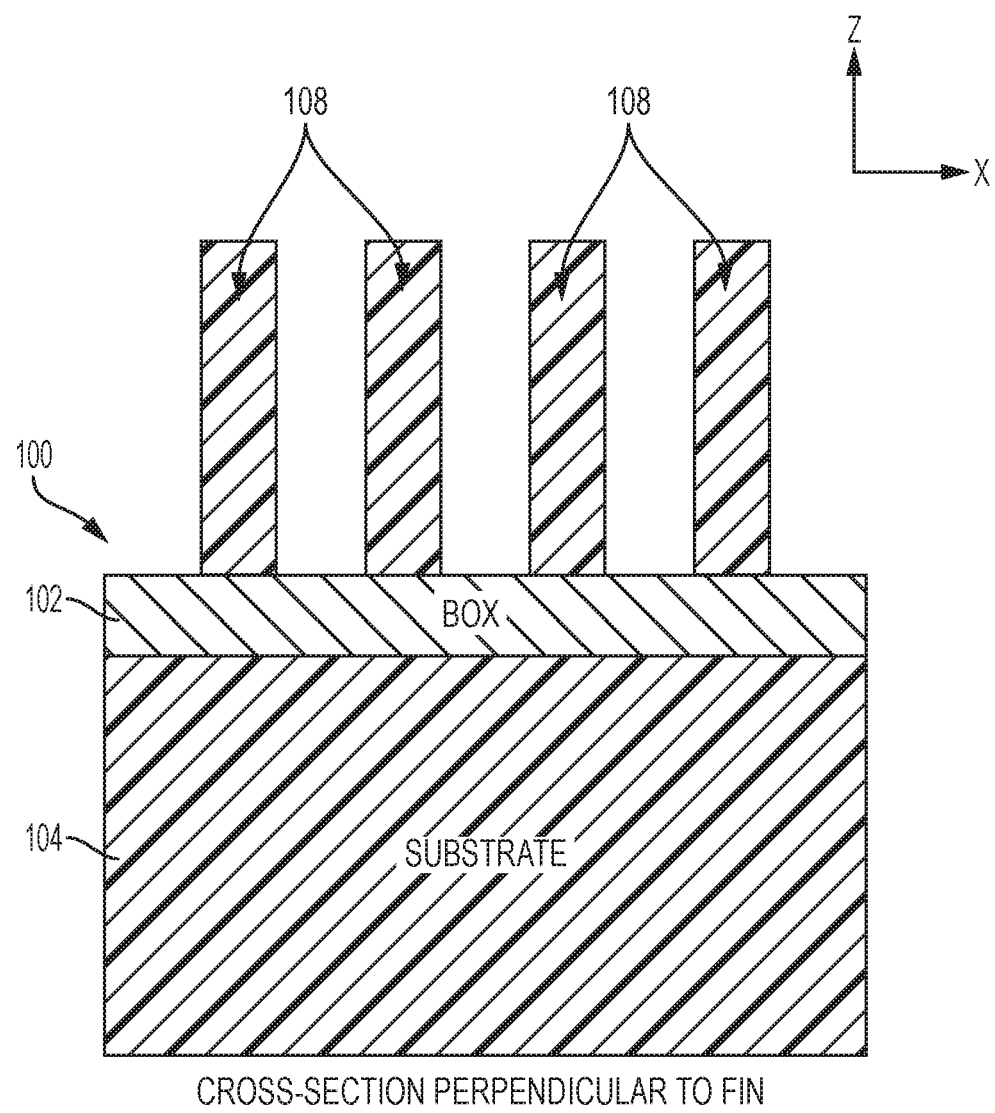
FIG. 2B is a cross-sectional view in a first orientation taken along line B-B of FIG. 2A.
Figure 2C:
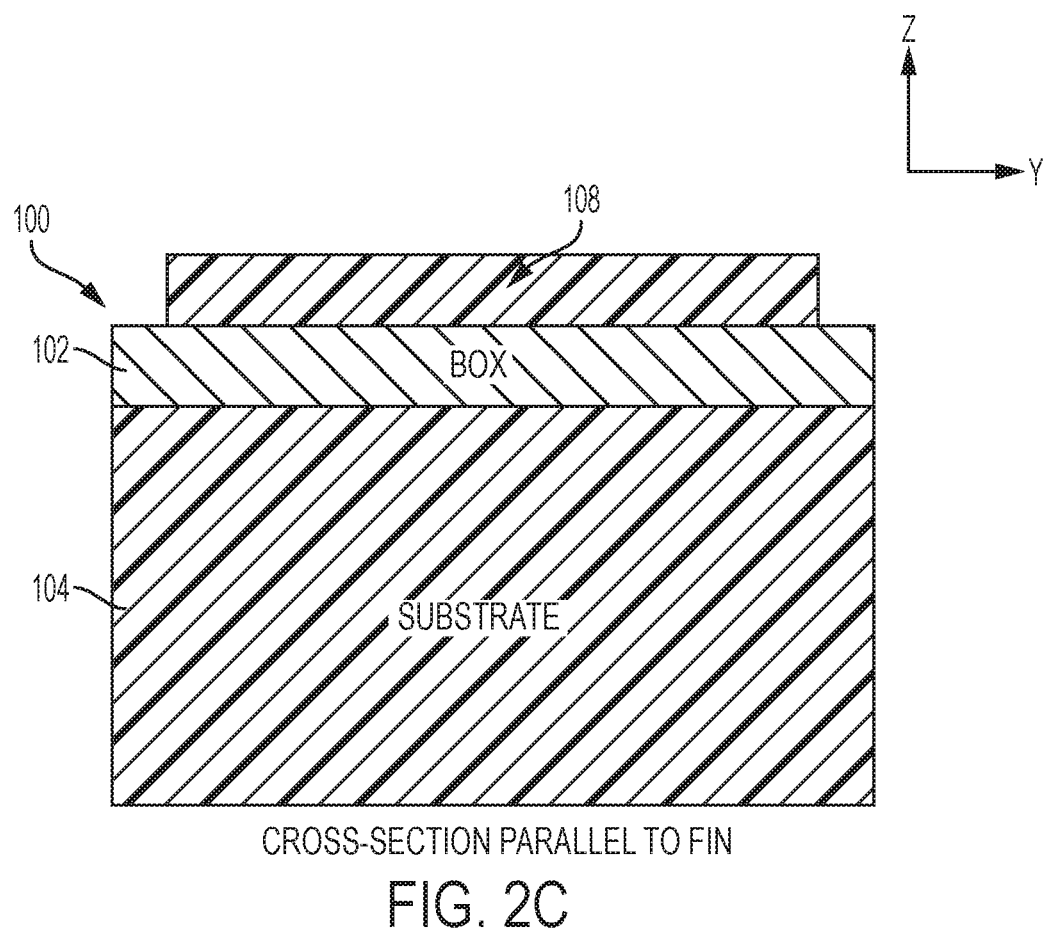
FIG. 2C is a cross-sectional view in a second orientation taken along line C-C of FIG. 2A showing a semiconductor fin extending along the length of the SOI substrate.

With reference now to FIGS. 1A-1B, a starting substrate 100 is illustrated according to a non-limiting embodiment. The starting substrate 100 extends along a first axis (e.g., X-axis) to define a length, a second axis (e.g., Y axis) to define a width, and a third axis (Z-axis) to define a height. The substrate 100 is formed as a semiconductor-on-insulator (SOI) substrate, for example, including a buried insulator layer 102 (FIG. 1B) formed on an upper surface of a bulk substrate layer 104. The buried insulator layer 102 is formed of, for example, silicon dioxide ($SiO_2$) and the bulk substrate layer 104 is formed, for example, of silicon (Si). The buried insulator layer 102 has a vertical thickness (e.g., height) ranging from, for example, approximately 10 nanometers to approximately 400 nm. An active semiconductor layer 106 is formed atop the buried insulator layer 102, and is formed of a semiconductor material such as, for example, Si. The active semiconductor layer 106 has a vertical thickness (e.g., height) ranging from, for example, approximately 10 nm to approximately 60 nm. Turning to FIGS. 2A-2C, the active semiconductor layer 106 is patterned to form one or more semiconductor fins 108 on the upper surface of the buried insulator layer 102. According to a non-limiting embodiment, the semiconductor fins 108 are initially formed from Si, for example. Various fin fabrication methods can be used to form the semiconductor fins 108 such as, for example, a sidewall image transfer (SIT) process. The semiconductor fins 108 extend along the X-axis to define a fin length, the Y-axis to define a fin width, and the Z-axis to define a fin height. The fin width ranges from approximately 3 nm to approximately 30 nm, the fin length ranges from approximately 50 nm to approximately 3000 nm, and the fin height ranges from ranges from approximately 10 nm to approximately 60 nm. The pitch between each fin may range, for example, from approximately 10 nm to approximately 60 nm.

Figure 3A:
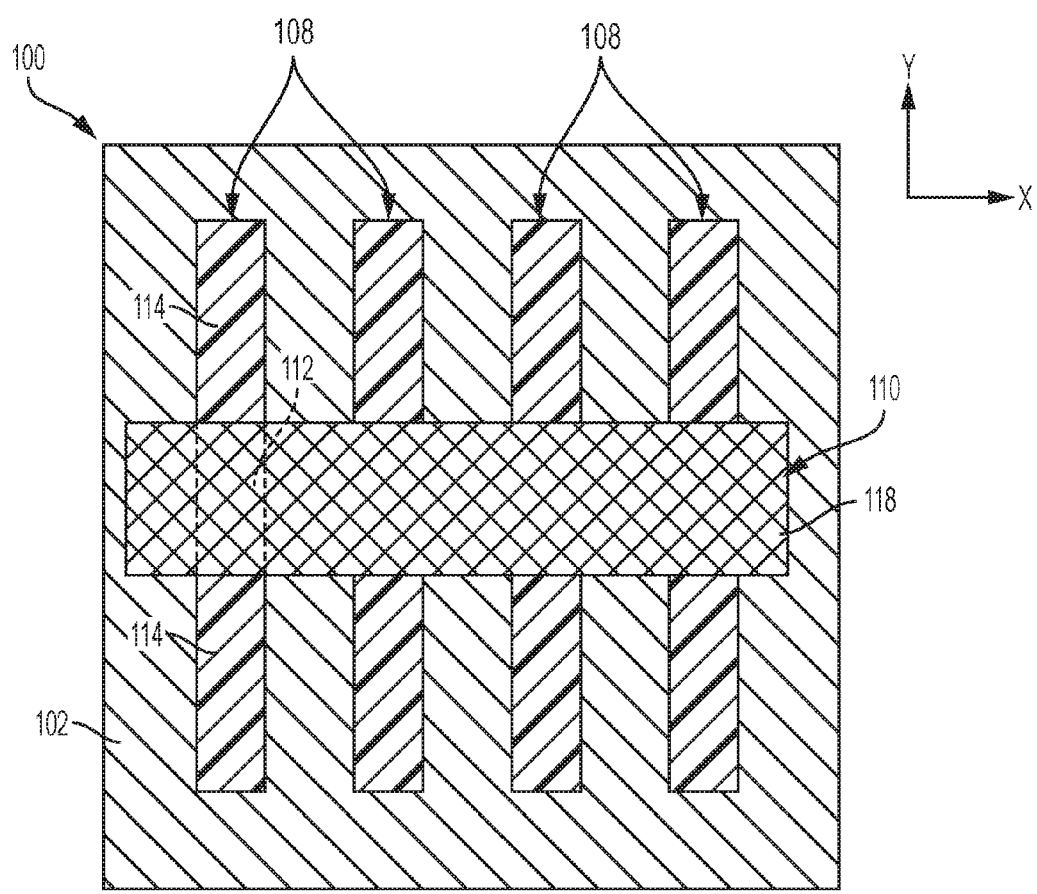
FIG. 3A is a top view of the SOI substrate shown in FIGS. 2A-2C following formation of a dummy gate structure atop the buried insulator layer and wrapping around a channel region of the fins.
Figure 3B:
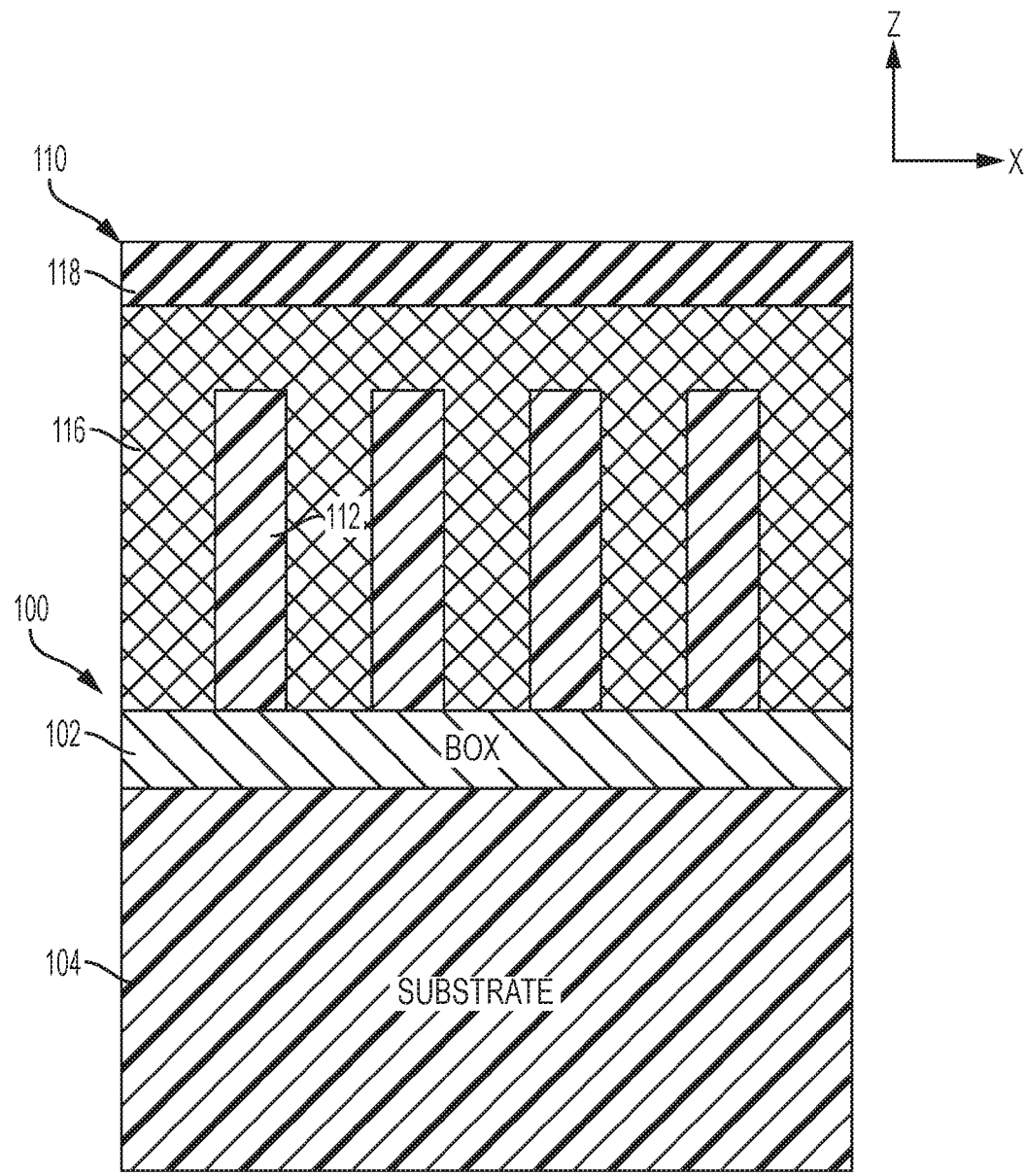
FIG. 3B illustrates the SOI substrate of FIG. 3A in the first orientation showing the dummy gate structure including a gate cap formed atop a dummy gate material.
Figure 3C:
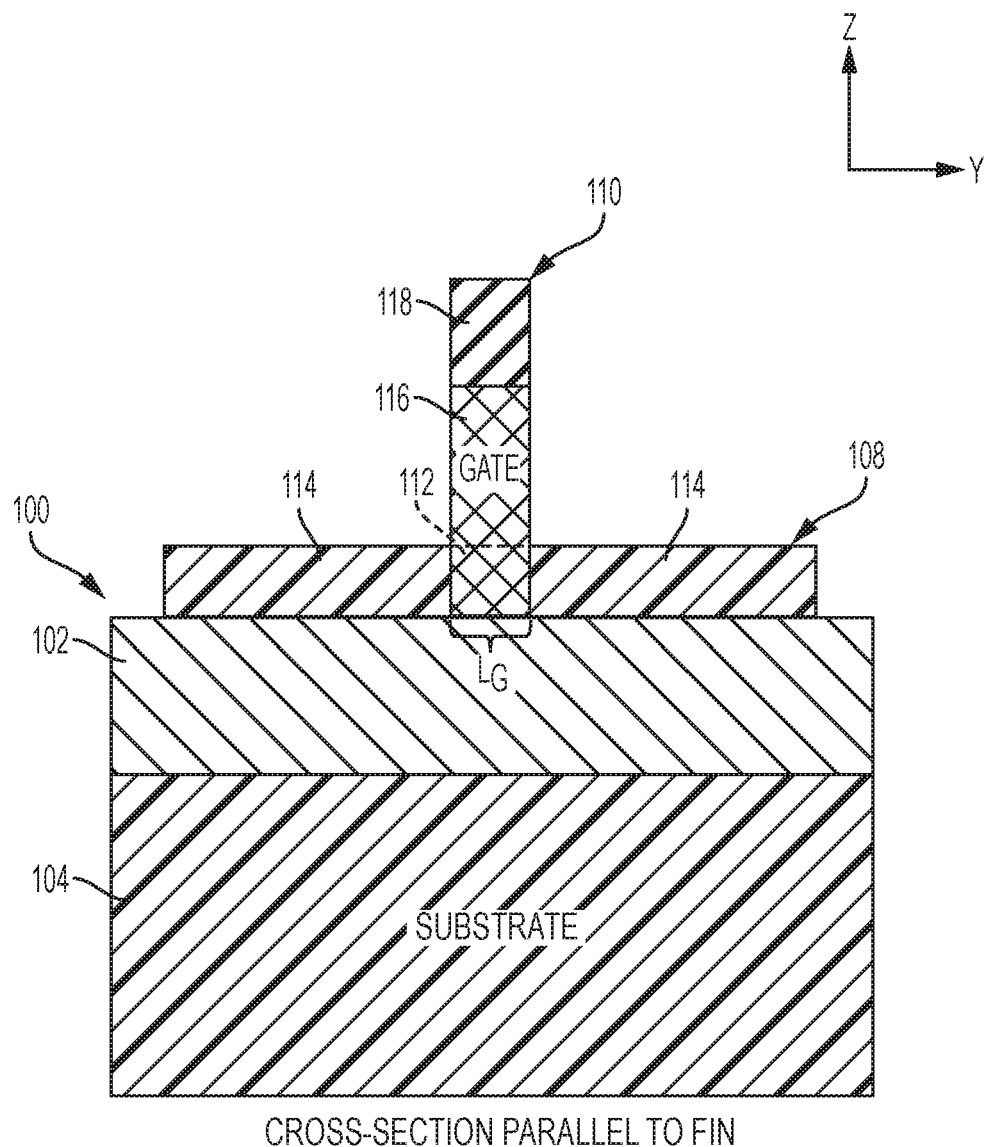
FIG. 3C illustrates the SOI substrate of FIGS. 3A-3B in the in the first orientation showing the dummy gate structure extending along the length of the substrate to define a gate length ($L_G$)

Referring to FIGS. 3A-3C, the substrate 100 is illustrated following a well-known gate formation process. Following completion of the gate formation process, a dummy gate structure 110 is formed atop the buried insulator layer 102. The dummy gate structure 110 wraps around sidewalls and an upper surface of a channel region 112 of the semiconductor fins 108. Accordingly, the dummy gate structure 110 defines the opposing source/drain regions 114 of the fins 108. The dummy gate structure 110 includes a dummy gate material 116 and a dummy gate cap 118. The dummy gate material 116 is formed from, for example, polysilicon (PolySi), and wraps around the channel region 112 to define $L_G$. The dummy gate cap 118 is formed on the upper surface of the dummy gate material 116, and is formed from, for example, silicon nitride (SiN) to serve as a hardmask that preserves the underlying dummy gate material 116 during the gate formation process as understood by one of ordinary skill in the art. Although not illustrated, the dummy gate structure 110 may further include a gate oxide layer (not shown). The gate oxide layer is interposed between the dummy gate structure 110 and the fin 108. The gate oxide layer may be formed as a dummy gate oxide layer, with the intention of being replaced by a high-k gate oxide layer or metal gate layer as understood by one of ordinary skill in the art.

Figure 4A:
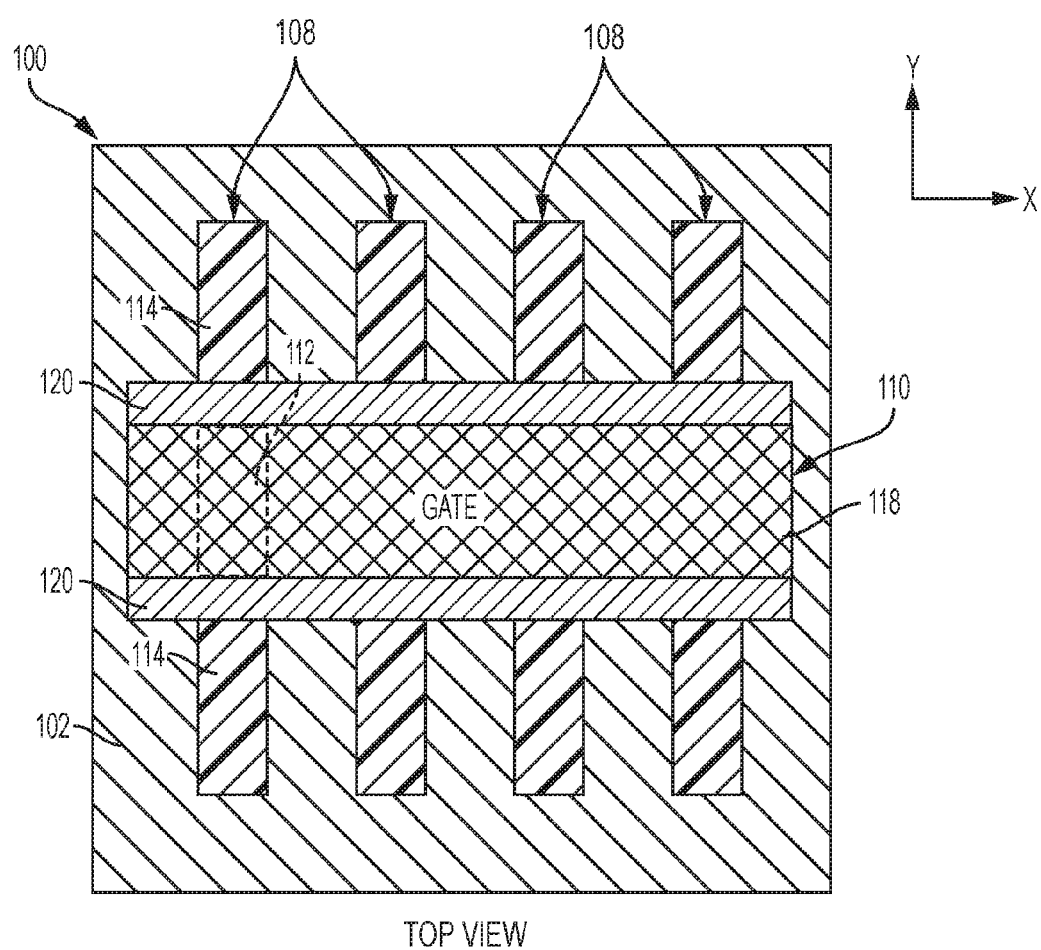
FIG. 4A is a top view of the SOI substrate shown in FIGS. 3A-3C following formation of gate spacers on opposing sidewalls of the dummy gate structure.
Figure 4B:
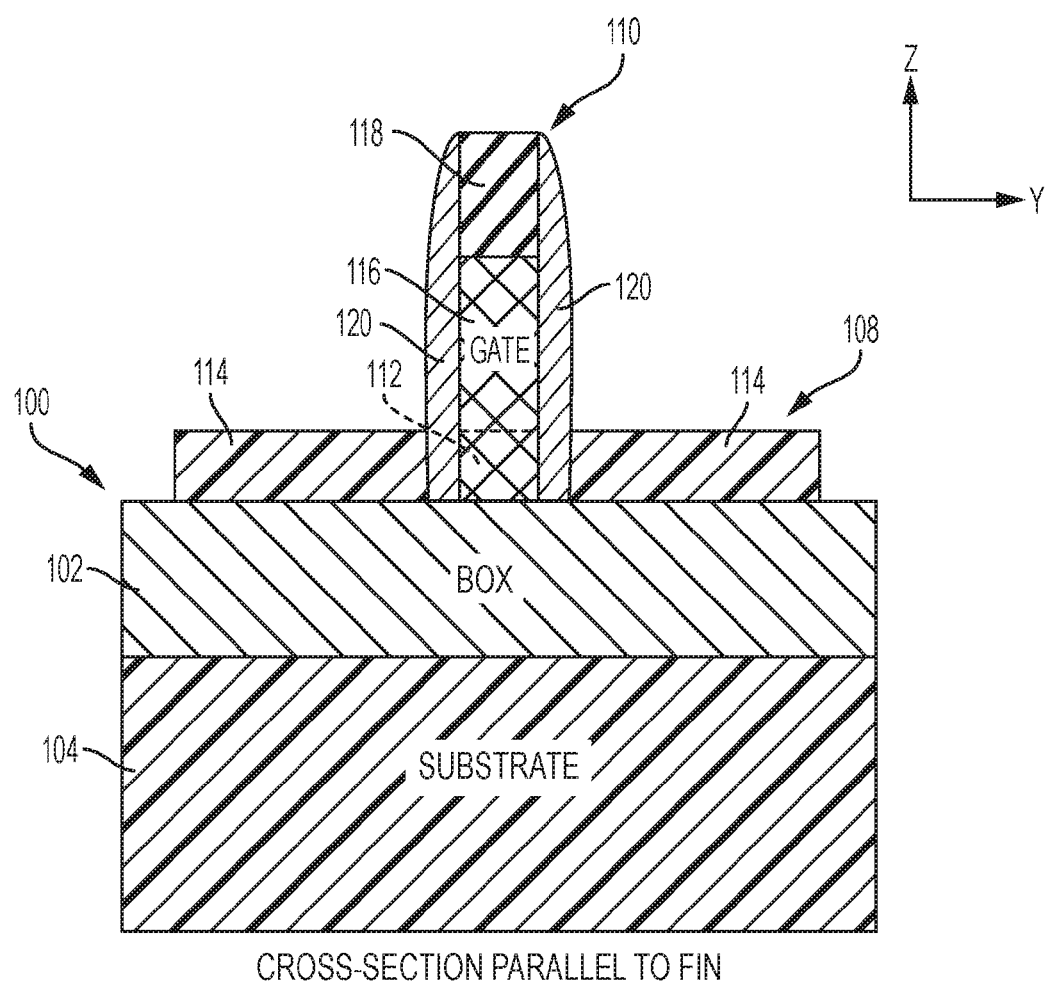
FIG. 4B illustrates the SOI substrate of FIG. 4A in the second orientation.

Referring to FIGS. 4A-4B, the substrate 100 is illustrated following the formation of gate spacers 120 on opposing sidewalls of the dummy gate material 116 and the gate cap 118. Various well-known spacer patterning processes may be used to form the gate spacers 120 as understood by one of ordinary skill in the art. According to an embodiment, the spacers are formed from silicon nitride (SiN) using a reactive-ion etch (RIE) process, for example.

Figure 5A:
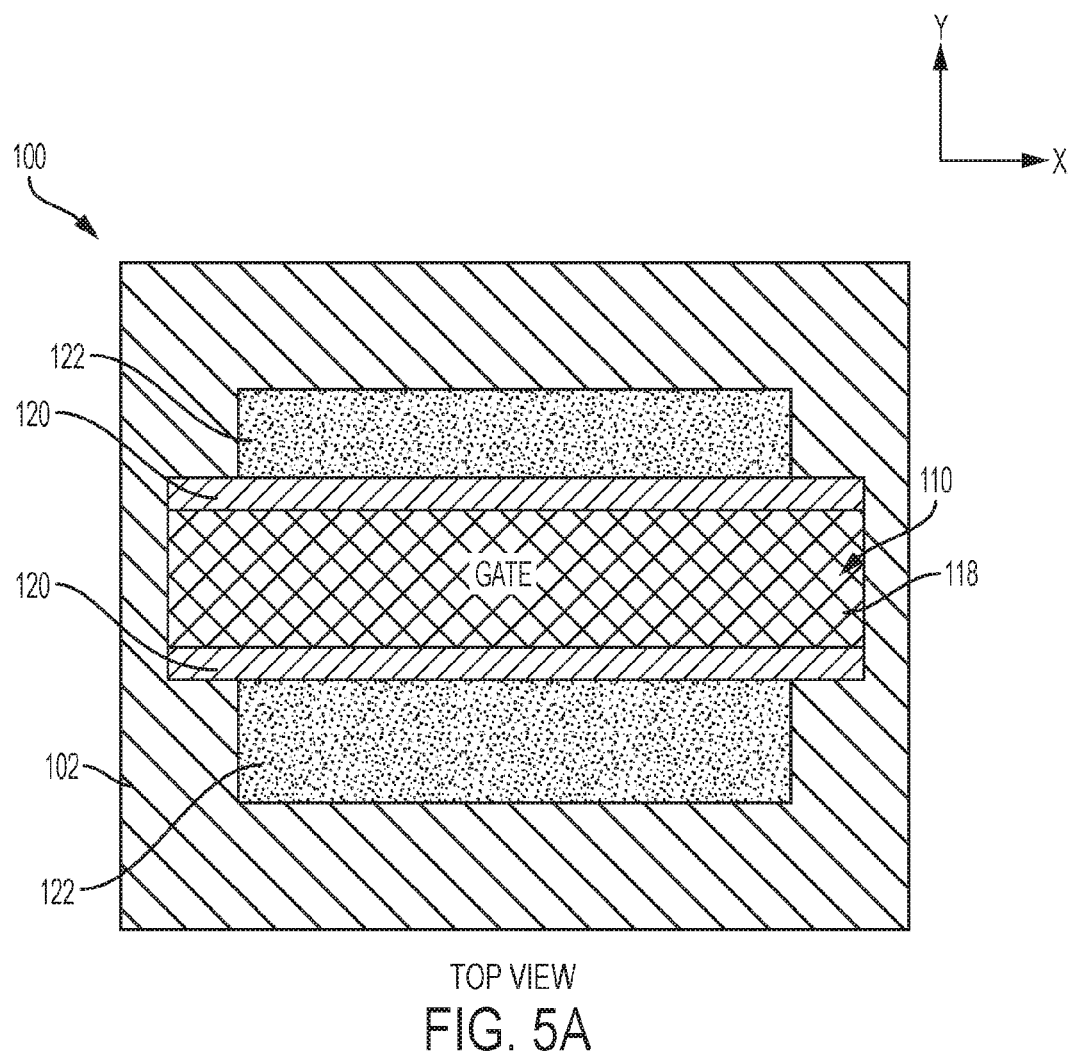
FIG. 5A is a top view of the SOI substrate illustrated in FIGS. 4A-4B following a semiconductor epitaxially growth process that merges together the source/drain regions of the fins.
Figure 5B:
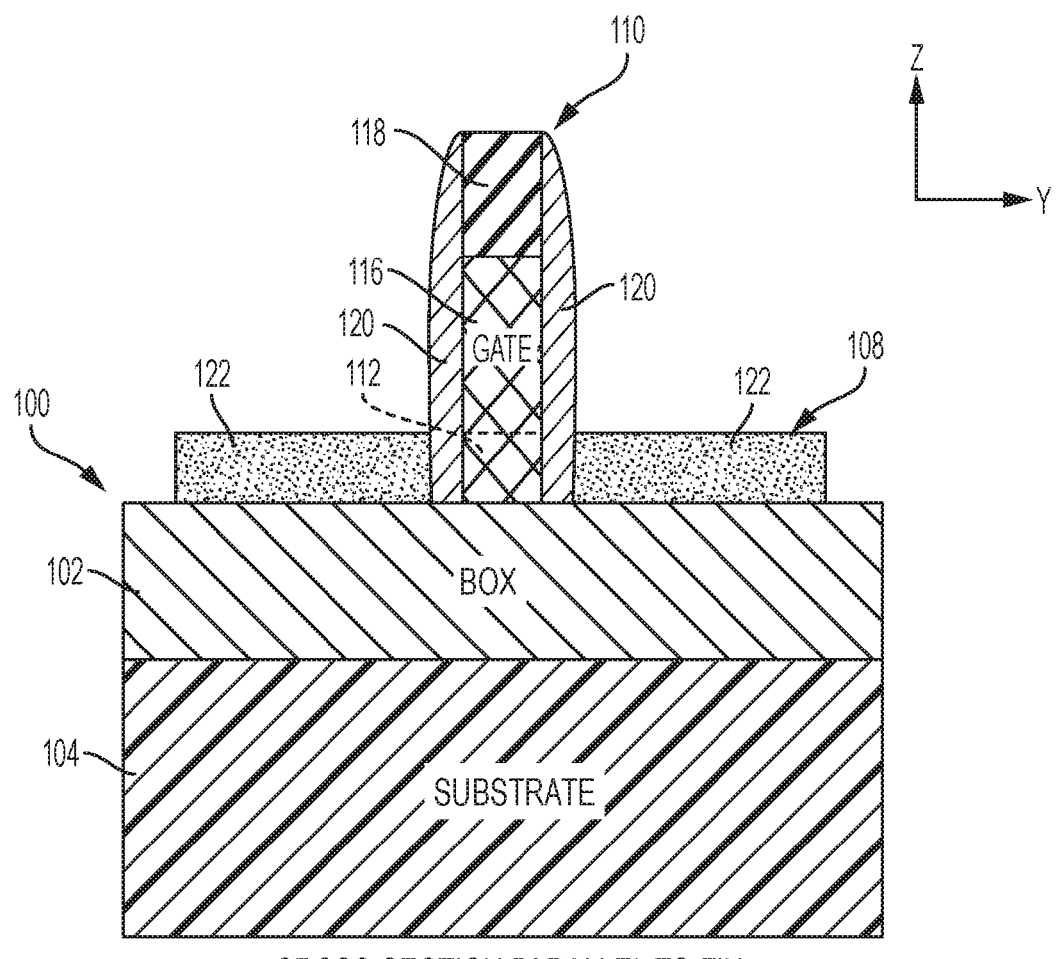
FIG. 5B illustrates the SOI substrate of FIG. 5A in the second orientation.

Referring now to FIGS. 5A-5B, the substrate 100 is illustrated following an optional process of merging together source/drain regions 114 of the fins 108. More specifically, a semiconductor material may be epitaxially grown from the exposed semiconductor surfaces of the fins 108 so as to form merged S/D regions 122. Various well-known epitaxy processes may be used to grow an undoped or highly-conductive material, such as Si or SiGe, on sidewalls and upper surfaces of the semiconductor fins 108. The merging epitaxy process may include an in-situ doping of the epitaxy material with an impurity such as boron (B), arsenic (As), or phosphorus (P) for example to make it highly conductive. An optional ion-implantation step may be performed before and/or after the epitaxial growth process. Thereafter, a well-known anneal process (not shown) may be performed after merging the fins 108 to activate the dopants within the conductive material.

The epitaxy process is continued until the source/drain regions 114 are partially or completely merged, thereby minimizing the series resistance to maintain a low parasitic resistance. Merging the fins 108 in this manner also establishes conductivity between all the source/drain regions (now covered by the epitaxial semiconductor material in FIGS. 5A-5B) using a single contact-via (not shown in FIGS. 5A-5B) that contacts the merged S/D regions 122, as well as also allowing more flexible placement of the contact via. The merging process may increase the height of the source/drain region between 0 nm to 40 nm. The epitaxy process used to form the merged source/drain region 122 may be carried out using various well-known techniques including, but not limited to, vapor phase epitaxy (VPE), molecular beam epitaxy (MBE) or liquid phase epitaxy (LPE) with a gaseous or liquid precursor, such as, for example, silicon tetrachloride.

Figure 6A:
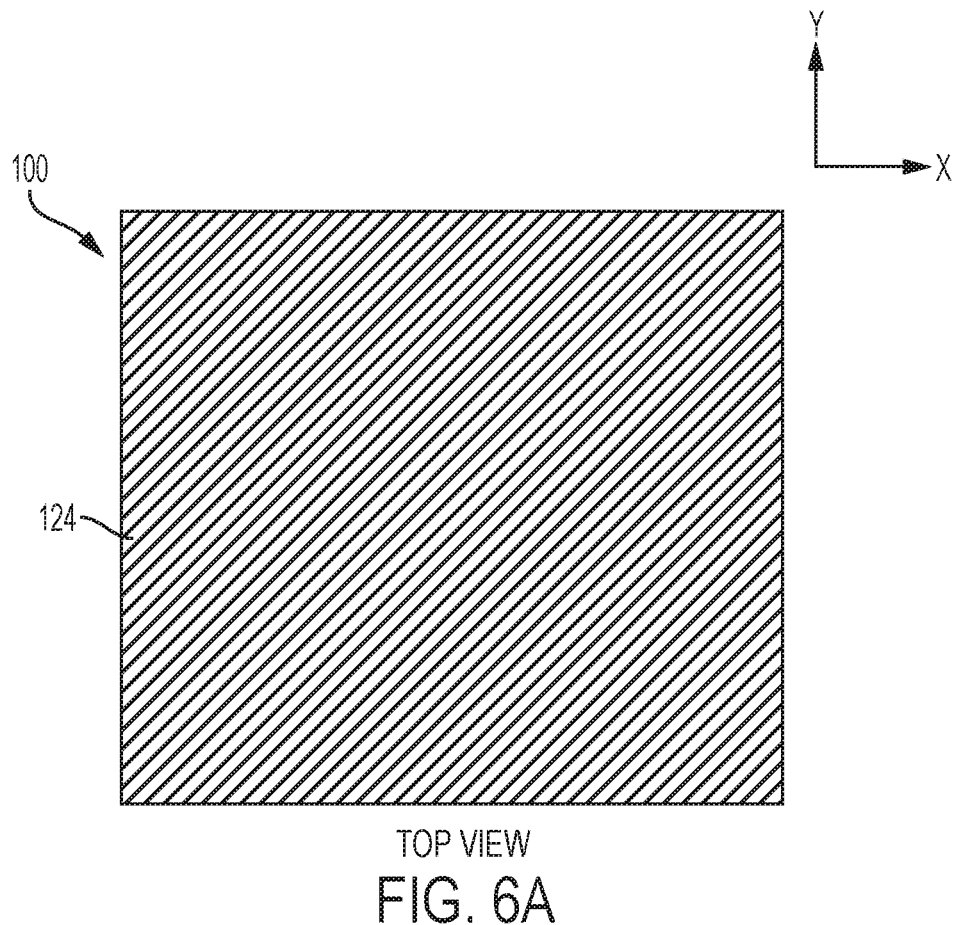
FIG. 6A is a top view of the SOI substrate illustrated in FIGS. 5A-5B after depositing a flowable insulator layer atop the buried insulator layer so as to cover the fins and the dummy gate structure.
Figure 6B:
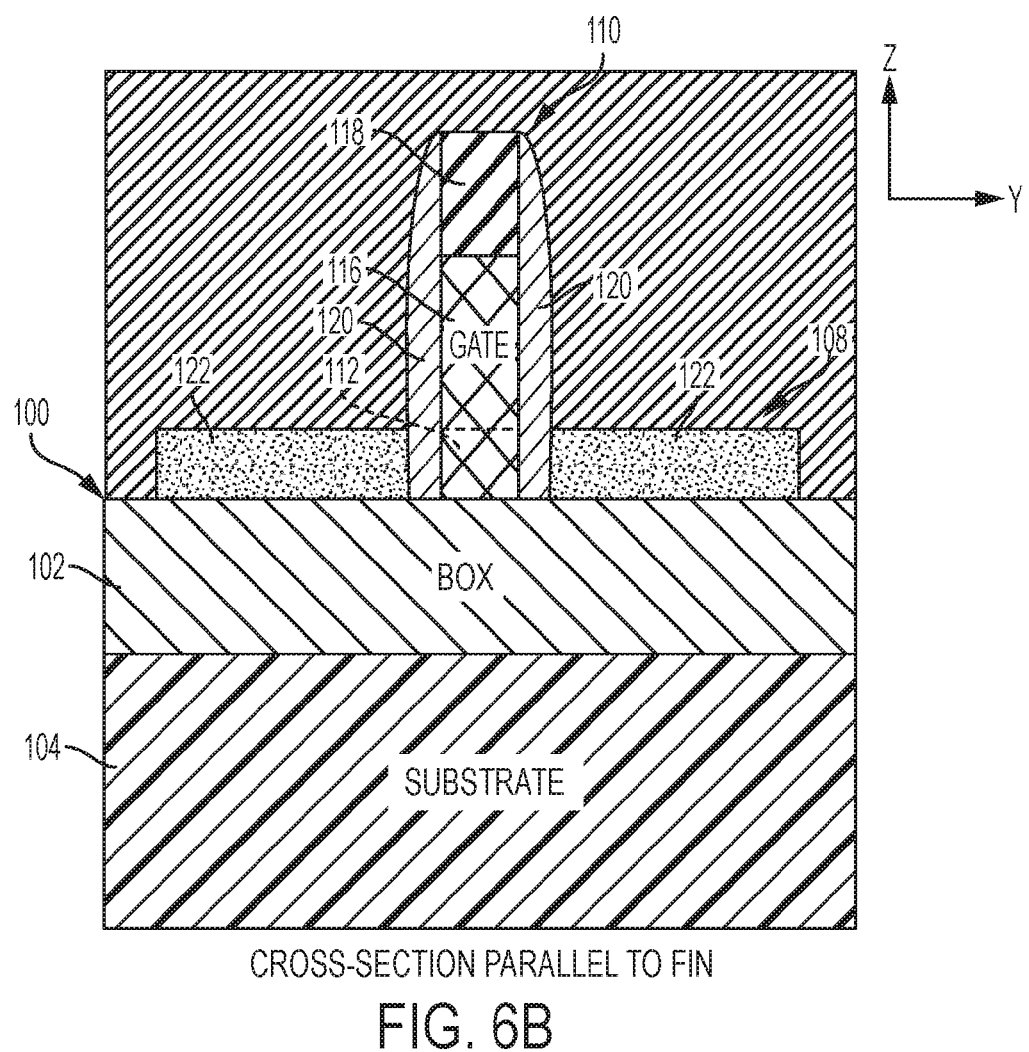
FIG. 6B illustrates the SOI substrate of FIG. 6A in the second orientation.
Figure 7A:
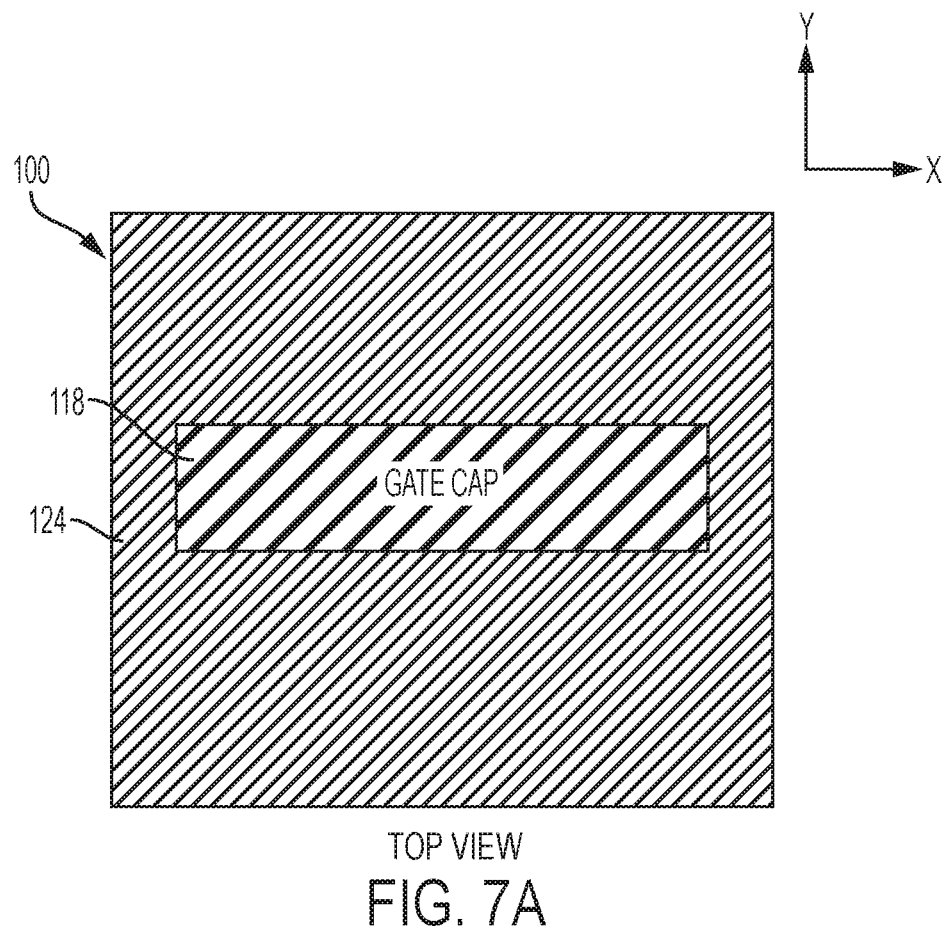
FIG. 7A is a top view of the SOI substrate illustrated in FIGS. 6A-6B following a chemical-mechanical planarization process that recesses the flowable insulator layer and stops on the upper surface of the gate cap.
Figure 7B:
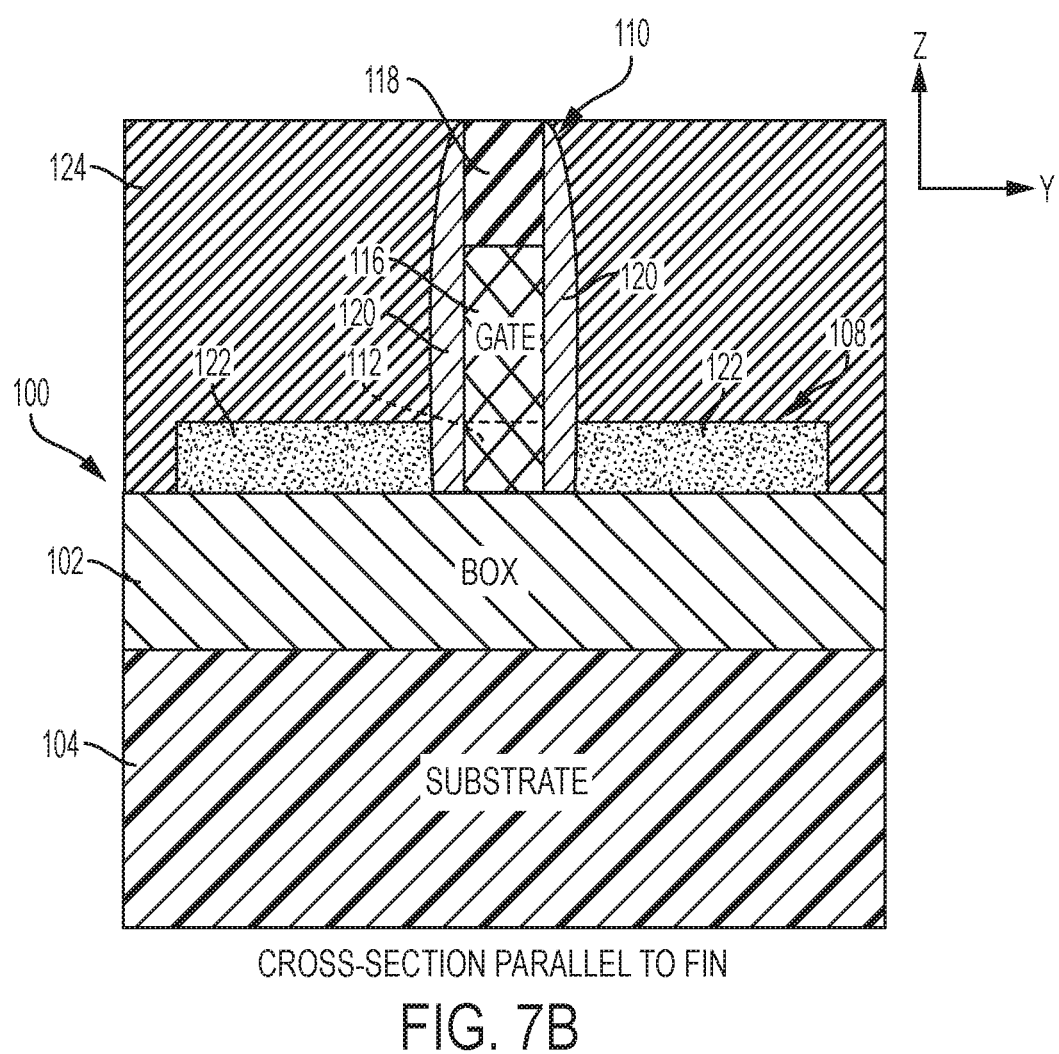
FIG. 7B illustrates the SOI substrate of FIG. 6A in the second orientation showing the gate cap and gate spacers flush with the recessed flowable insulator layer.

Turning to FIGS. 6A-6B, the substrate 100 is shown following deposition of a flowable insulator layer 124 on an upper surface of the buried insulator layer 102. The flowable insulator layer 124 is deposited so as to completely surround and cover the fins 108 and the gate stack 110. The material forming the flowable insulator layer 124 may include various oxide materials including, but not limited to, $SiO_2$. Following the deposition of the flowable insulator layer 124, a chemical-mechanical planarization (CMP) process can be performed. The CMP process may be selective to the gate cap material (E.g., SiN) so as to stop on the upper surface of the gate cap 118. In this manner, the upper surfaces of the gate cap 118 and spacers 120 are formed flush with the upper surface of the recessed flowable insulator layer 124 as further illustrated in FIGS. 7A-7B.

Figure 8A:
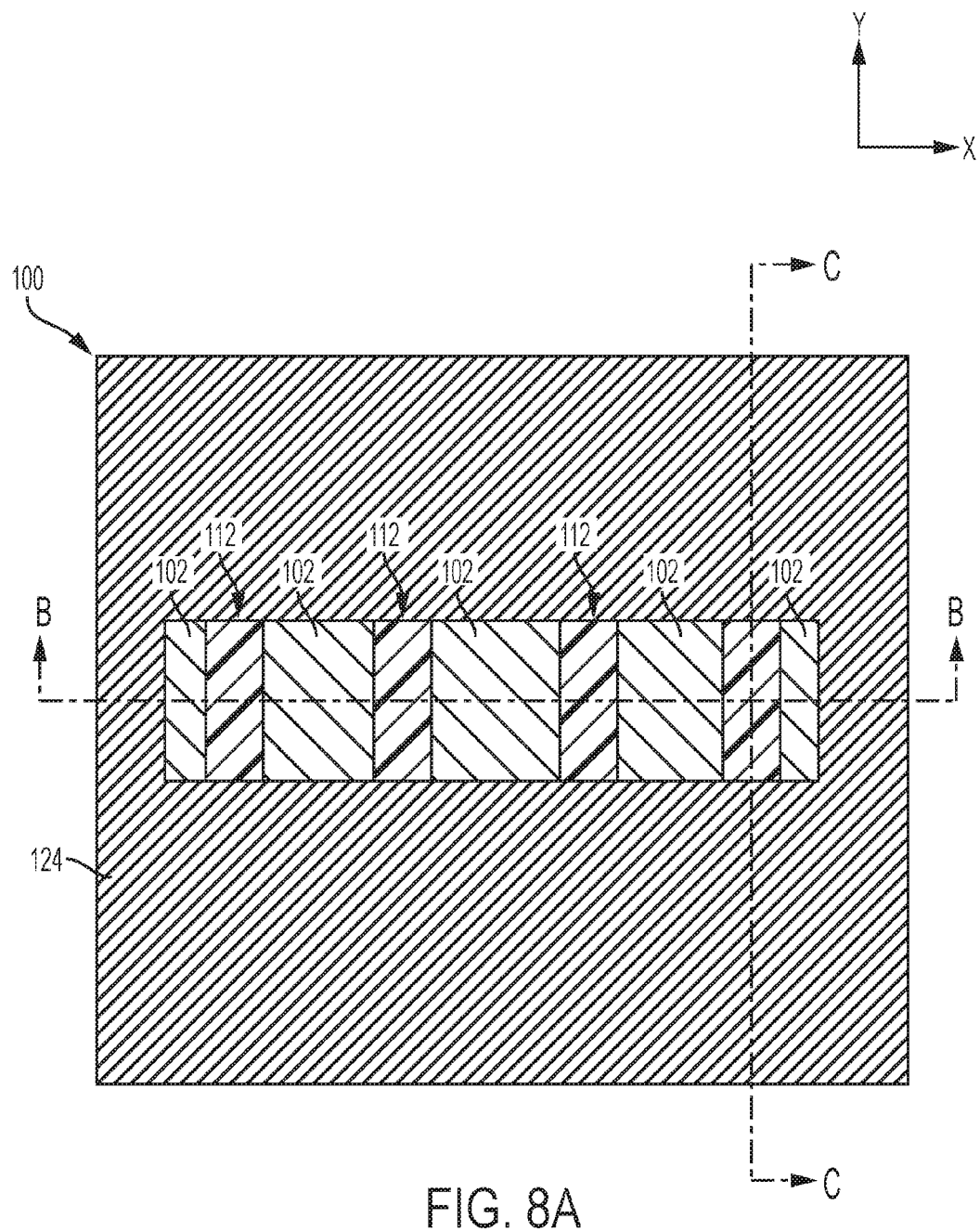
FIG. 8A is a top view of the SOI substrate illustrated in FIGS. 7A-7B following removal of the gate cap and dummy gate material so as to form a gate pocket that exposes the channel region of the fins and the buried insulator layer.
Figure 8B:
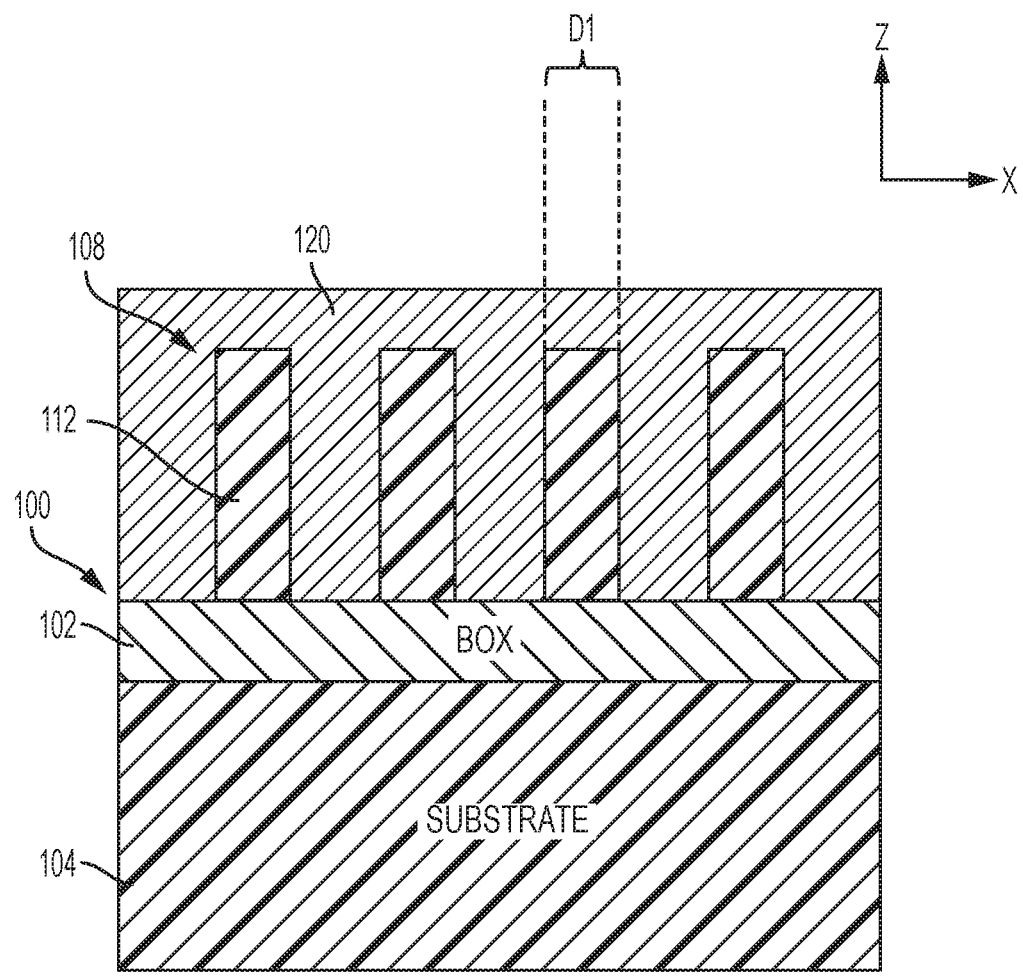
FIG. 8B illustrates the SOI substrate of FIG. 8A in the first orientation along line B-B to show the channel regions having a first thickness ($D_1$) formed atop the buried insulator layer.
Figure 8C:
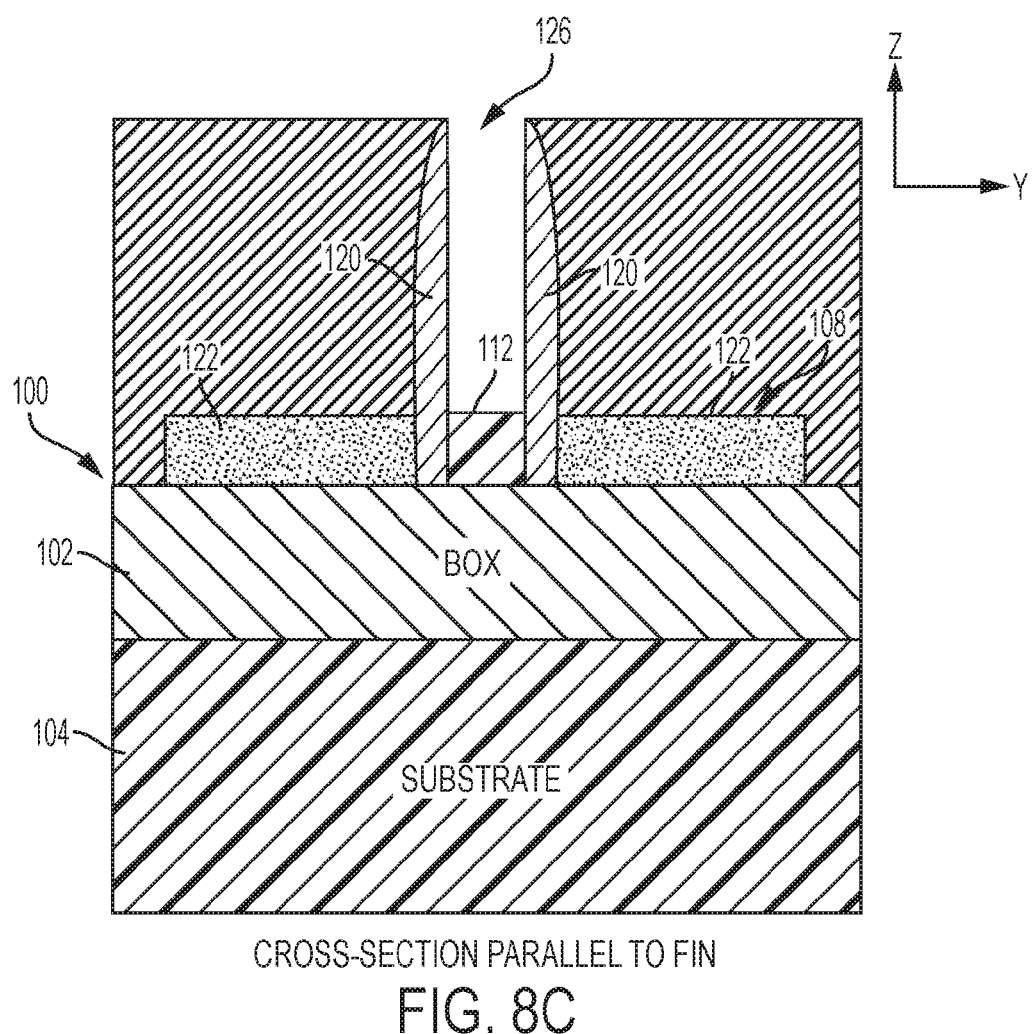
FIG. 8C illustrates the SOI substrate of FIGS. 8A-8B in the second orientation along line C-C showing the channel region formed of first semiconductor material while the merged source/drain regions are formed of a second semiconductor material.

Referring now to FIGS. 8A-8C, the semiconductor device 100 is illustrated following removal of the dummy gate structure 110. Removal of the dummy gate structure 110 forms a gate pocket 126 that exposes the channel region 112 of the semiconductor fins 108 and the underlying buried insulator layer 102. At this stage in the fabrication process the channel regions 112 have an initial thickness $D_1$ (see FIG. 8B). The dummy gate structure 110, which may include the sacrificial dielectric layer (not shown), if present, is removed (i.e., pulled) using various etching processes such as, an ammonium hydroxide etching process, for example, which is implemented in well-known replacement metal gate fabrication processes. Since the source/drain regions are covered by the gate spacers 120 and flowable insulator layer 124, no additional masking layers are necessary to remove the dummy gate structure 110.

Figure 9A:
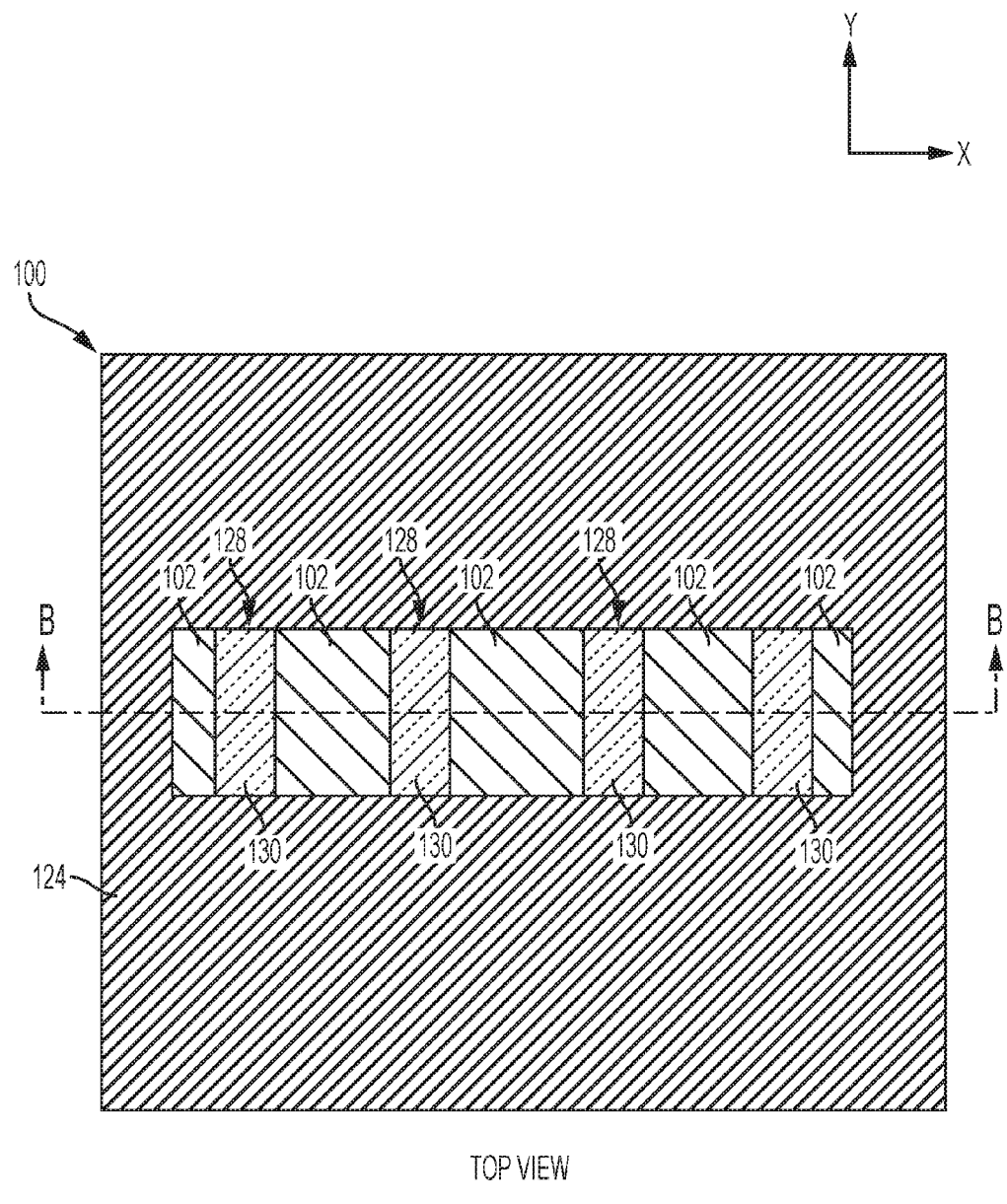
FIG. 9A is a top view of the SOI substrate illustrated in FIGS. 8A-8C after forming a heterojunction material on the fins exposed by the gate pocket so as to form respective dual channel regions.
Figure 9B:
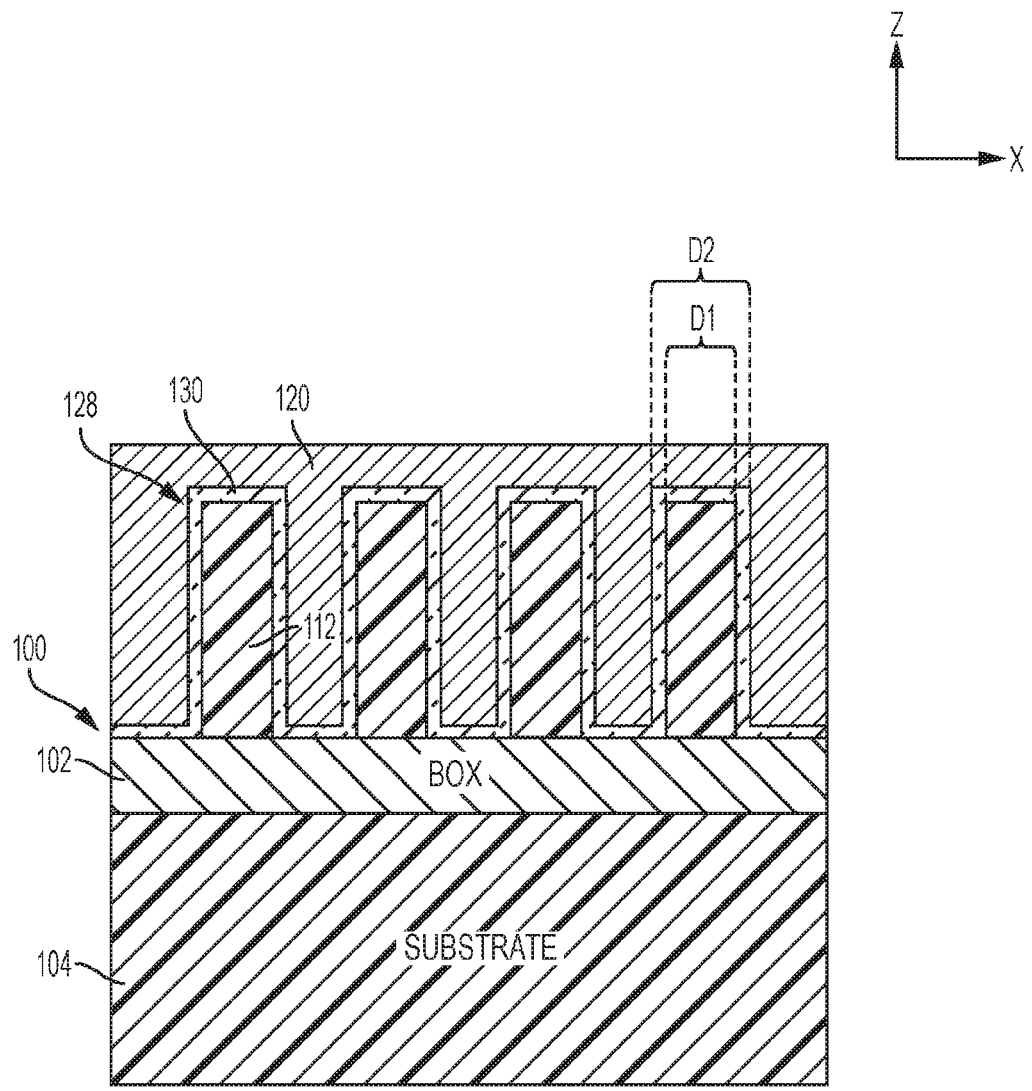
FIG. 9B illustrates the SOI substrate of FIG. 9A in the first orientation to show a dual channel region including a surface channel portion that completely surrounds a buried channel portion.
Figure 9C:
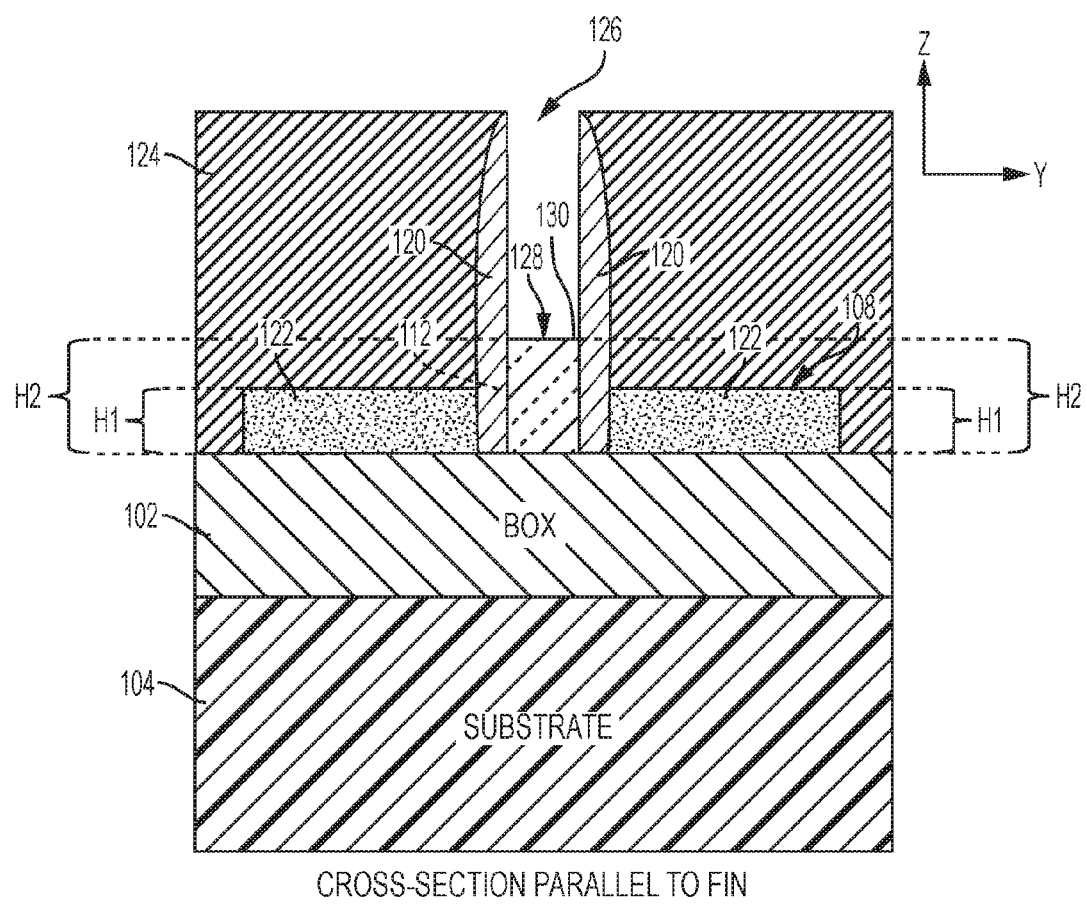
FIG. 9C illustrates the SOI substrate of FIGS. 9A-9B in the second orientation to show the dual channel region having a second thickness ($D_2$) that is greater than the first thickness ($D_1$) of the initial channel region.

Turning to FIGS. 9A-9C, the substrate 100 is shown after converting the initial channel regions 112 into respective dual channel regions 128. More specifically, a heterojunction semiconductor material is formed on the sidewalls and upper surface of the initial channel region 112 exposed by the gate pocket 126. The heterojunction material results in the formation of a dual channel region 128 including a surface channel portion 130 that completely surrounds the initial channel region 112. Going forward, the initial channel region 112 will be referred to as the buried channel portion 112 of the dual channel region 128.

The heterojunction semiconductor material can be deposited, for example, by epitaxially growing an in-situ doped heterojunction semiconductor material from exterior surfaces of the fins 108 exposed by the gate pocket 126. According to an embodiment, for a NMOS transistor, the heterojunction semiconductor material is an epitaxially grown SiGe material doped with boron (B). In this case, the concentration of Ge with respect to Si ranges, for example, from approximately 25% to approximately 30%. The concentration of boron can be approximately 5e19 ($5 \times 10^{19}$), or greater.

The surface channel portion 130 can have a thickness ranging, for example, from approximately 1 nm to approximately 6 nm. In this manner, the formation of the surface channel portion 130 essentially defines a new thickness ($D_2$) of the dual channel region 128 as further illustrated in FIGS. 9B-9C. For instance, the initial thickness $D_1$ can be increased by a range of approximately 2 nm to approximately 12 nm to define the new thickness $D_2$ of the dual channel region 128. That is, the thickness of the surface channel portion 130 (e.g., 3 nm) is added to the thickness of the initial channel region (e.g., 6 nm) to form a new thickness $D_2$ (e.g., 12 nm) of the dual channel region 128. $D_2$ can be defined, for example, as: $D_2 = D_1$ 2*surface channel thickness.

Since the source/drain regions 122 are covered by the flowable insulator layer 124 during the formation of the dual channel region 128, the source/drain regions 122 maintain their initial height $H_1$. Accordingly, the source/drain regions 122 have a first height $H_1$, while the dual channel region 128 has a second height $H_2$ that is greater or smaller than the height $H_1$ of the source/drain regions 122. For example, the source/drain regions 122 have a first height $H_1$, while the dual channel region 128 has a second height $H_2$ that is greater than the height $H_1$ of the source/drain regions 122 as further illustrated in FIG. 9C. Although the source/drain regions 122 are shown to be merged using the epitaxially grown semiconductor material, it should be appreciated that individual source/drain regions 114 (excluding the epitaxially grown material) located beneath the flowable insulator layer 124 may optionally exist at this stage of the fabrication process. Although the differences between the height $H_1$ of source/drain regions 122 and the H$_2$ of the dual channel region 128 is described, it should be appreciated that the thickness of the source/drain regions 122 (e.g., distances perpendicular to the height) may be formed differently from the thickness of the dual channel region 128.

The dual channel region 128 achieves various technical aspects that improve over conventional finFET devices. According to an embodiment, the surface channel portion 130 is configured to provide a first carrier density and the buried channel portion 112 is configured to provide a second carrier density that is greater than the first carrier density, thereby reducing carrier trapping compared to conventional finFET devices. According to a non-limiting embodiment, the carrier density (when the completed semiconductor device operates in the on-state) is at least an order of magnitude higher in the buried channel portion 112 than the surface channel portion 130.

Figure 10A:
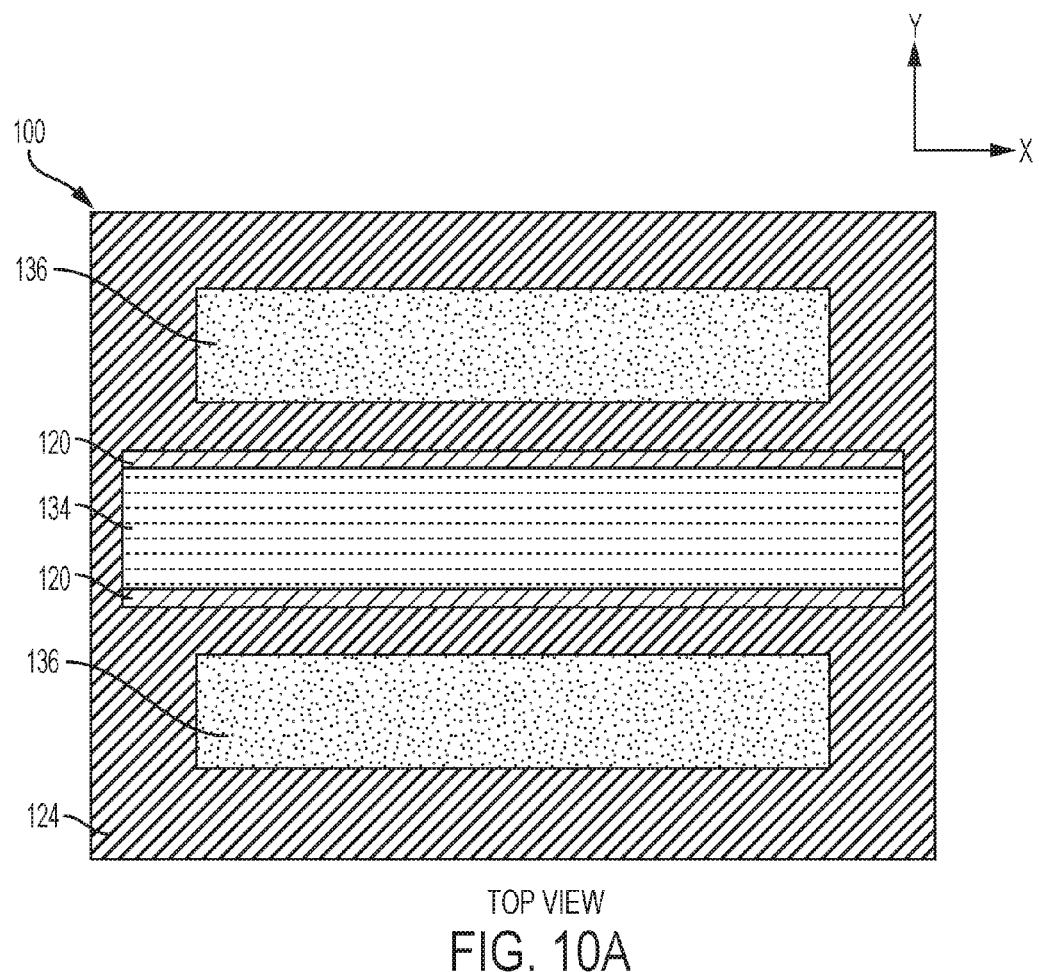
FIG. 10A is a top view of the substrate illustrated in FIGS. 9A-9C after forming a planarized metal gate structure in the gate pocket, and source/drain electrodes in the flowable insulator layer to contact the merged source/drain regions of the device.
Figure 10B:
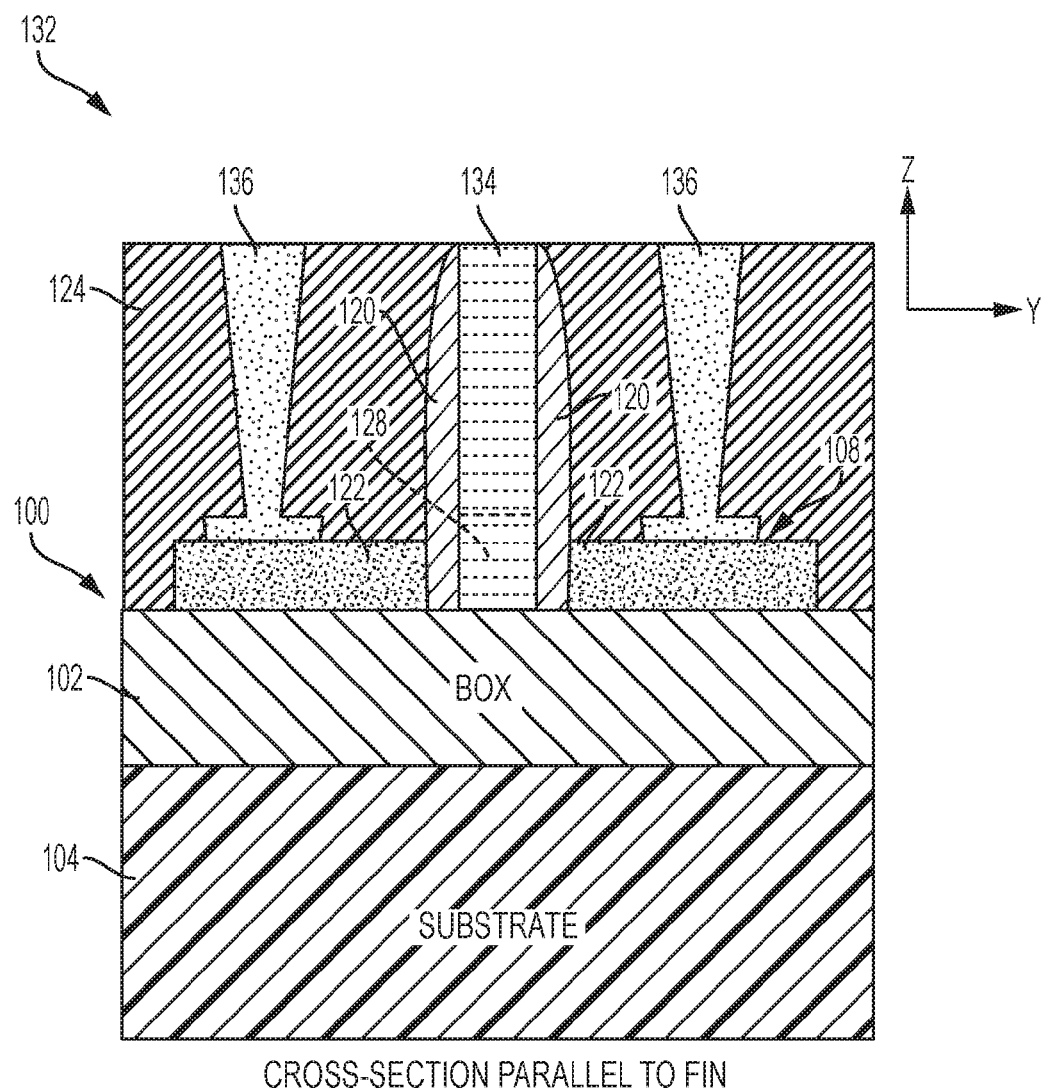

Turing now to FIGS. 10A-10B, a final semiconductor device 132 is illustrated following formation of a metal gate structure 134 and S/D contacts 136. The metal gate structure 134 is formed by deposing a metal gate material in the gate pocket 126 between the gate spacers 120 and atop the buried insulator layer 102. The metal gate structure 134 wraps around the sidewalls and the upper surface of the dual channel region 128 so as to serve as a gate electrode as understood by one of ordinary skill in the art. The metal gate structure 134 can be formed of various metal gate materials including, but not limited to, tungsten (W).

Although not illustrated, it should be appreciated that the metal gate structure 134 may include one or more work function metal layers including, but not limited to, a titanium nitride (TiN) liner and a tantalum nitride (TaN) liner, formed on sidewalls of the metal gate structure 134 as understood by one of ordinary skill in the art. A gate dielectric layer (not shown), such as a single layer or multi-layer high-k gate dielectric layer may also be disposed atop the buried insulator layer and surface channel region prior to depositing the gate metal material in the gate pocket 126. In this case, it should be appreciated that the metal gate structure 134 includes the metal gate material, the gate dielectric layer, and the work function metals. The gate dielectric may include various materials including, but not limited to, SiO$_2$, SiOxNy, HfO$_2$, hafnium silicate, etc. It should also be appreciated that a chemical-mechanical planarization (CMP) process may be performed to recess any gate metal material deposited on an upper surface of the flowable insulator layer 124. The CMP process can be selective to the gate spacer material such that the upper surface of the metal gate structure 134 is formed flush with the upper surface of the gate sidewalls 120 and the upper surface of the flowable insulator layer 124 as further illustrated in FIGS. 10A-10B.

The S/D contacts 136 may be formed using various well-known process understood by those having ordinary skill in the art. For example, a pair of contact trenches (not shown) can be formed in the flowable insulator layer 124 so as to expose upper surfaces of the merged S/D regions, respectively. The contact trenches can then be filled with a metal material or metal silicide-forming metal so as to form S/D contacts 136 formed on the upper surface of the merged S/D regions 122. The metal material may include various materials capable of forming a conductive interface with the merged S/D regions including, but is not limited to, nickel (Ni), platinum (Pt), cobalt (Co), and alloys, such as a nickel-platinum alloy (NiPt).

Accordingly, various embodiments of the invention described above provide a finFET device including a buried-channel that provides low noise and high mobility, while having superior short-channel characteristics such as. At least one embodiment includes a dual channel region including a surface channel portion that completely surrounds a buried channel portion. For a NMOS transistor, the buried channel portion comprises a semiconductor material such as silicon (Si), for example, while the surface channel portion comprises a heterojunction semiconductor material such as, for example, SiGe. Compared to conventional finFET devices, at least one embodiment of the invention provides an overall lower charge density such that the flicker noise (i.e., 1/f) is reduced without the need to increase the interfacial SiON layer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of reducing carrier number fluctuation and flicker noise of a finFET device, the method comprising:

forming, on an upper surface of a semiconductor substrate, at least one semiconductor fin completely comprising a first semiconductor material that extends from the upper surface of the semiconductor substrate to an upper surface of the at least one semiconductor fin, the at least one semiconductor fin having a channel region interposed between opposing source/drain regions;

forming a flowable insulator layer on the source/drain regions, and forming a dummy gate structure on the channel region;

forming a high-k gate oxide layer between the dummy gate structure and the at least one semiconductor fin;

selectively removing the dummy gate structure with respect to the flowable insulator layer so as to expose the channel region of the at least one semiconductor fin; and forming a dual channel region to increases a distance of carrier paths further away from the high-k gate oxide layer, the dual channel region formed by depositing a heterojunction semiconductor material in the area where the dummy gate has been removed such that dual channel region includes a surface channel portion that completely surrounds sidewalls and an upper surface of a buried channel portion.

\* \* \* \* \*